(12) United States Patent
Arai et al.

(10) Patent No.: US 12,241,913 B2
(45) Date of Patent: Mar. 4, 2025

(54) CONTACT PROBE, PROBE HOLDER AND PROBE UNIT

(71) Applicant: NHK Spring Co., Ltd., Yokohama (JP)

(72) Inventors: Hajime Arai, Kanagawa (JP); Kazuya Soma, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 97 days.

(21) Appl. No.: 18/161,161

(22) Filed: Jan. 30, 2023

(65) Prior Publication Data

US 2023/0251286 A1 Aug. 10, 2023

(30) Foreign Application Priority Data

Feb. 10, 2022 (JP) .................... 2022-019667

(51) Int. Cl.
*G01R 1/067* (2006.01)
(52) U.S. Cl.
CPC ..... *G01R 1/06738* (2013.01); *G01R 1/06722* (2013.01)
(58) Field of Classification Search
CPC ............ G01R 1/06738; G01R 1/06722; G01R 1/06733; G01R 1/07314
See application file for complete search history.

(56) References Cited

U.S. PATENT DOCUMENTS

| | | | | |
|---|---|---|---|---|
| 5,045,780 A | * | 9/1991 | Swart | G01R 1/06722 324/754.16 |
| 11,940,465 B2 | | 3/2024 | Soma et al. | |
| 2012/0079731 A1 | | 4/2012 | Ruck | |
| 2013/0033278 A1 | | 2/2013 | Ohta et al. | |
| 2013/0099811 A1 | * | 4/2013 | Lee | G01R 1/06722 324/754.11 |

FOREIGN PATENT DOCUMENTS

| | | |
|---|---|---|
| CN | 102859370 A | 1/2013 |
| CN | 102369412 B | 2/2015 |
| JP | 2019-219350 A | 12/2019 |
| KR | 10-2016-0096968 A | 8/2016 |
| KR | 10-2021-0123358 A | 10/2021 |

OTHER PUBLICATIONS

Machine translation of KR-100430621-B1 (Year: 2004).*
Machine translation of KR-20160109587 (Year: 2016).*
Office Action dated Oct. 16, 2023, issued in the corresponding TW patent application No. 112103958 and English translation thereof.
Office Action dated Oct. 5, 2024, issued in the corresponding KR patent application No. 10-2023-0010046 and English translation thereof.

* cited by examiner

*Primary Examiner* — G. M. A Hyder

(74) *Attorney, Agent, or Firm* — Troutman Pepper Locke LLP

(57) ABSTRACT

A contact probe includes: a first plunger; a second plunger; and a coil spring provided between the first and second plungers and configured to connect the first and second plungers to each other so as to freely advance and retreat. The first plunger is provided with a groove portion formed on a side surface of the first plunger.

10 Claims, 15 Drawing Sheets

CONTACT PROBE, PROBE HOLDER AND PROBE UNIT

This application is based upon and claims the benefit of priority of the prior Japanese Patent Application No. 2022-019667, filed on Feb. 10, 2022, the entire contents of which are incorporated herein by reference.

BACKGROUND

The present disclosure relates to a contact probe, a probe holder, and a probe unit.

In the related art, when a conduction state inspection or an operation characteristic inspection of an inspection target such as a semiconductor integrated circuit or a liquid crystal panel is performed, a probe unit including a plurality of contact probes and a probe holder that houses the plurality of contact probes is used in order to achieve electrical connection between the inspection target and a signal processing device that outputs an inspection signal (e.g., see JP 2019-219350 A). The contact probe includes two plungers and a coil spring that connects the two plungers, and the entire contact probe is expanded and contracted by the expansion and contraction of the coil spring due to an external load. The contact probe illustrated in JP 2019-219350 A includes a cylindrical outer plunger and a cleaning shaft that is housed in the outer plunger so as to freely advance and retreat with respect to the outer plunger. The contact probe removes deposits (e.g., cutting chips of solder or others) adhered to the tip of the outer plunger by advancing and retreating the cleaning shaft.

SUMMARY

When the deposits removed from the outer plunger is stuck between the contact probe and the probe holder, the plunger and the deposits interfere with each other, and an operation failure may occur at the time of expansion and contraction of the contact probe.

There is a need for a contact probe, a probe holder, and a probe unit capable of suppressing the occurrence of an expansion and contraction operation failure due to foreign materials.

According to an aspect of the present disclosure, there is provided a contact probe including: a first plunger; a second plunger; and a coil spring provided between the first and second plungers and configured to connect the first and second plungers to each other so as to freely advance and retreat, wherein the first plunger is provided with a groove portion formed on a side surface of the first plunger.

According to another aspect of the present disclosure, there is provided a probe holder including: a holder hole configured to hold a contact probe, the contact probe including a first plunger, a second plunger, and a coil spring provided between the first plunger and the second plunger and being configured to connect the first plunger and the second plunger so as to freely advance and retreat; and a groove portion provided in the holder hole and extending from an opening of the holder hole on a side through which the first plunger is inserted.

According to still another aspect of the present disclosure, there is provided a probe unit including: a contact probe including a first plunger, a second plunger, and a coil spring provided between the first plunger and the second plunger and configured to connect the first plunger and the second plunger so as to freely advance and retreat; a probe holder including a holder hole configured to hold the contact probe; and a groove portion provided on a side surface of the first plunger or on a side of the holder hole through which the first plunger is inserted.

DETAILED DESCRIPTION

An embodiment for carrying out the present disclosure will be described below in detail together with the drawings. Note that the present disclosure is not limited to the following embodiment and its modifications. Each of the drawings referred to in the following description merely schematically illustrates a shape, a size, and a positional relationship to such an extent that the contents can be understood. Therefore, the present disclosure is not limited only to the shape, the size, and the positional relationship illustrated in each of the drawings.

Figure 1:
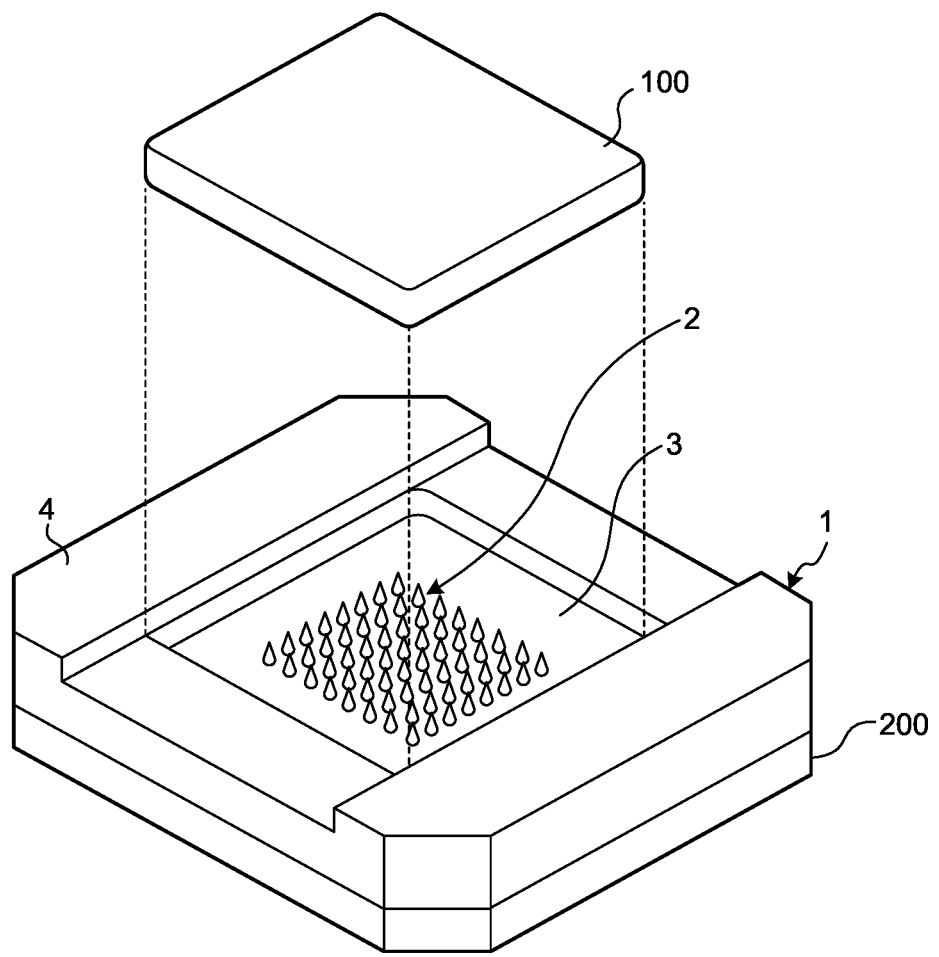
FIG. 1 is a perspective view illustrating a configuration of a probe unit including a contact probe according to an embodiment.

FIG. 1 is a perspective view illustrating a configuration of a probe unit according to an embodiment. A probe unit 1 illustrated in FIG. 1 is a device used when an electrical characteristic inspection of a semiconductor integrated circuit 100 which is an inspection object is performed, and is a device which electrically connects the semiconductor integrated circuit 100 and a circuit board 200 which outputs an inspection signal to the semiconductor integrated circuit 100.

The probe unit 1 includes: conductive contact probes 2 (hereinafter, simply referred to as "probes 2") that come into contact with electrodes of the semiconductor integrated circuit 100 and the circuit board 200, which are two different objects to be contacted at both ends in a longitudinal direction; a probe holder 3 that houses and holds a plurality of probes 2 according to a predetermined pattern; and a holder member 4 that is provided around the probe holder 3 and suppresses positional deviation of the semiconductor integrated circuit 100 in contact with the plurality of probes 2 during inspection.

Figure 2:
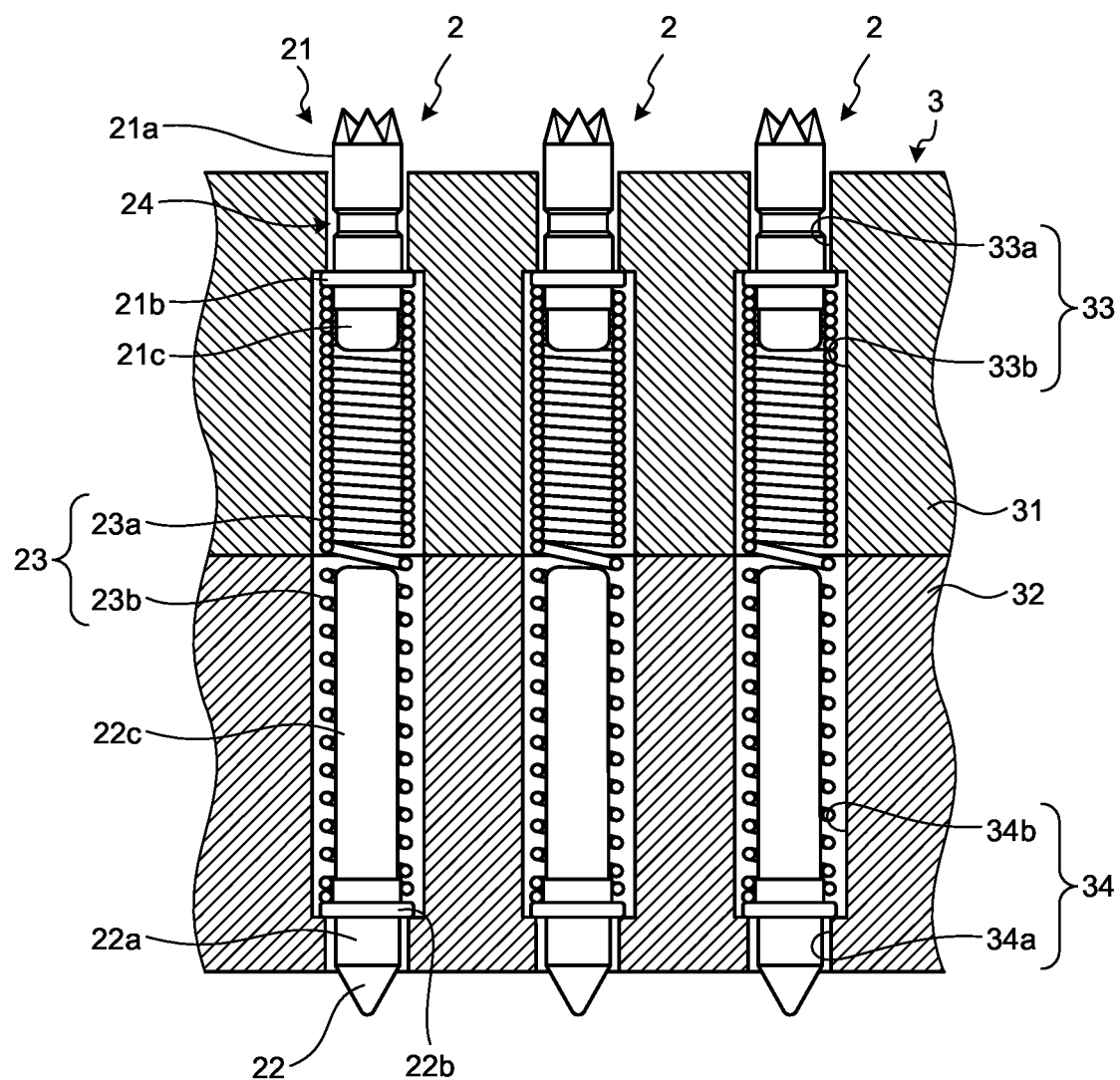
FIG. 2 is a partial cross-sectional view illustrating a configuration of a main part of the probe unit illustrated in FIG. 1.

FIG. 2 is a partial cross-sectional view illustrating a detailed configuration of the probe 2 housed in the probe holder 3. The probe 2 illustrated in FIG. 2 is made of a conductive material, and includes a first plunger 21 that comes into contact with an electrode of the semiconductor integrated circuit 100 when the semiconductor integrated circuit 100 is inspected, a second plunger 22 that comes into contact with an electrode of the circuit board 200 including an inspection circuit, and a coil spring 23 that is provided between the first plunger 21 and the second plunger 22 and connects the two first and second plungers 21 and 22 so as to freely advance and retreat. In FIG. 2, the first plunger 21, the second plunger 22, and the coil spring 23, which constitute the probe 2, have the same axis. In other words, the central axes of the first plunger 21, the second plunger 22, and the coil spring 23 are located on the same straight line. Note that the "same axis" includes deviations due to, for example, distortion of individual members and manufacturing errors. When the probe 2 is brought into contact with the semiconductor integrated circuit 100, the coil spring 23 expands and contracts in the axial direction, thereby mitigating an impact on the electrode of the semiconductor integrated circuit 100 and applying a load to the semiconductor integrated circuit 100 and the circuit board 200.

The first plunger 21 has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted. The first plunger 21 can move in the axial direction by the expansion and contraction action of the coil spring 23, and is urged toward the semiconductor integrated circuit 100 by the elastic force of the coil spring 23 to come into contact with the electrode of the semiconductor integrated circuit 100.

Figure 3:
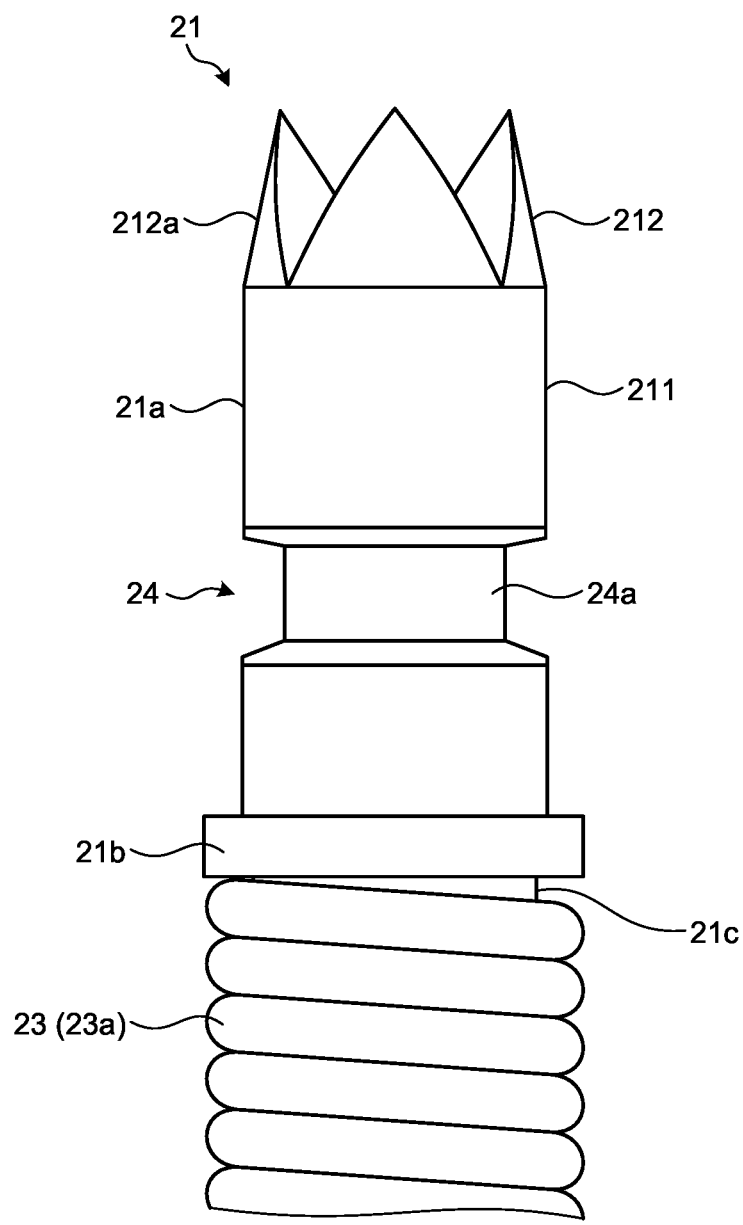
FIG. 3 is a diagram illustrating a configuration of a main part of the contact probe included in the probe unit according to the embodiment.

FIG. 3 is a diagram illustrating a configuration of a main part of the contact probe included in the probe unit according to the embodiment. In the first plunger 21, the tip portion 21a has a main body portion 211 extending from the flange portion 21b, and a contact portion 212 which is provided at an end portion of the main body portion 211 on the side opposite to the flange portion 21b side and comes into contact with an electrode of the semiconductor integrated circuit 100. In the present embodiment, the contact portion 212 is described as having a crown shape having a plurality of claw portions 212a, but may have another shape such as a conical shape or a spherical shape.

The main body portion 211 extends in a columnar shape. A groove portion 24 is formed in a part of the side surface of the main body portion 211. The groove portion 24 is formed by recessing a part of the side surface of the main body portion 211, and has a bottomed recessed portion 24a extending along the circumferential direction. The volume of the internal space formed by the groove portion 24 is set in accordance with, for example, the amount of cutting chips that can be generated by the number of inspections performed by the probe 2. The volume of the internal space corresponds to a volume of a space formed by a virtual outer circumferential surface in a case where the main body portion 211 does not have the groove portion 24 and a wall surface forming the groove portion 24.

Returning to FIG. 2, the second plunger 22 has a tip portion 22a which has a tapered tip shape and comes into contact with the electrode of the circuit board 200, a flange portion 22b having a diameter larger than that of the tip portion 22a, and a base end portion 22c which extends to the side opposite to the tip portion 22a via the flange portion 22b, has a diameter smaller than that of the flange portion 22b, and into which the other end portion of the coil spring 23 is press-fitted. The second plunger 22 can move in the axial direction by the expansion and contraction action of the coil spring 23, and is urged toward the circuit board 200 by the elastic force of the coil spring 23 to come into contact with the electrode of the circuit board 200.

The coil spring 23 has a tightly wound portion 23a tightly wound which is attached to the base end portion 21c of the first plunger 21, and a loosely wound portion 23b which is attached to the base end portion 22c of the second plunger 22 and is wound with a predetermined gap. The coil spring 23 is formed by, for example, winding one conductive wire.

An end portion of the tightly wound portion 23a is, for example, press-fitted into the base end portion 21c of the first plunger 21 and is in contact with the flange portion 21b. On the other hand, the end portion of the loosely wound portion 23b is press-fitted into the base end portion 22c of the second plunger 22 and is in contact with the flange portion 22b. The first plunger 21 and the second plunger 22 are joined to the coil spring 23 by winding force of the spring and/or soldering. The probe 2 expands and contracts in the axial direction by the expansion and contraction of the loosely wound portion 23b.

The probe holder 3 is formed by using an insulating material such as resin, machinable ceramic, or silicon, and is formed by stacking a first member 31 located on the upper surface side in FIG. 2 and a second member 32 located on the lower surface side. The same number of holder holes 33 and 34 for housing the plurality of probes 2 are formed in the first member 31 and the second member 32, respectively, and the holder holes 33 and 34 for housing the probes 2 are formed such that the axes of the holder holes are aligned with each other. The formation positions of the holder holes 33 and 34 are determined according to the wiring pattern of the semiconductor integrated circuit 100.

Each of the holder holes 33 and 34 has a stepped hole shape having a different diameter along the penetrating direction. In other words, the holder hole 33 is formed of a small-diameter portion 33a having an opening in the upper end surface of the probe holder 3 and a large-diameter portion 33b having a diameter larger than that of the small-diameter portion 33a. On the other hand, the holder hole 34 is formed of a small-diameter portion 34a having an opening in the lower end surface of the probe holder 3 and a large-diameter portion 34b having a diameter larger than that of the small-diameter portion 34a. The shapes of the holder holes 33 and 34 are determined according to the configuration of the probe 2 to be housed. The flange portion 21b of the first plunger 21 is in contact with the boundary wall surface between the small-diameter portion 33a and the large-diameter portion 33b of the holder hole 33, thereby having a function of preventing the probe 2 from coming off the probe holder 3. The flange portion 22b of the second plunger 22 is in contact with the boundary wall surface between the small-diameter portion 34a and the large-diameter portion 34b of the holder hole 34, thereby having a function of preventing the probe 2 from coming off the probe holder 3.

Figure 4:
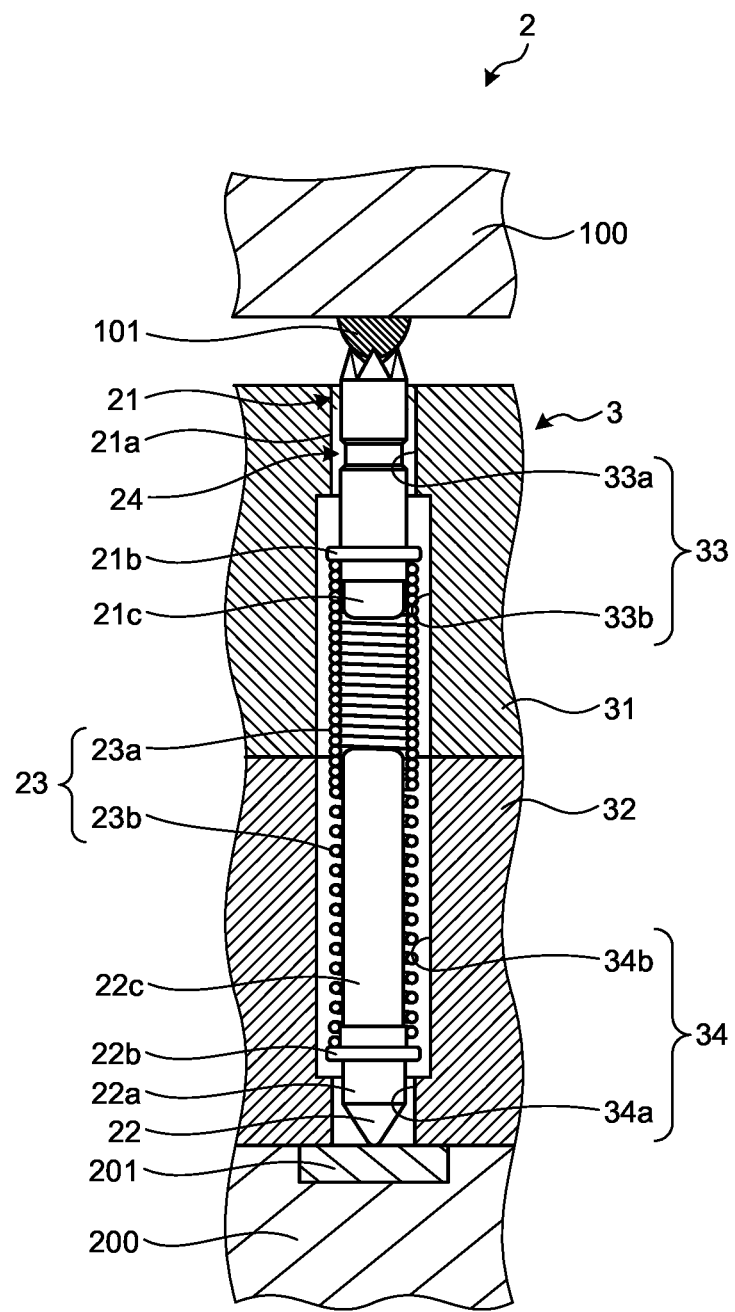
FIG. 4 is a partial cross-sectional view illustrating a configuration of a main part of the probe unit at the time of inspection of a semiconductor integrated circuit.

FIG. 4 is a diagram illustrating a state at the time of inspection of the semiconductor integrated circuit 100 using the probe holder 3. When the semiconductor integrated circuit 100 is inspected, the coil spring 23 is compressed along the longitudinal direction by a contact load from the semiconductor integrated circuit 100 and the circuit board 200. An inspection signal supplied from the circuit board 200 to the semiconductor integrated circuit 100 at the time of inspection reaches a connection electrode 101 of the semiconductor integrated circuit 100 from an electrode 201 of the circuit board 200 via the second plunger 22, the tightly wound portion 23a, and the first plunger 21 of the probe 2.

When the contact portion 212 of the first plunger 21 is brought into contact with the connection electrode 101 by the inspection, a part of the connection electrode 101 may be scraped, and cutting chips may adhere to the contact portion 212. The cutting chips that have come into contact with the contact portion 212 fall and enter between the first plunger 21 and the small-diameter portion 33a. At this point, the cutting chips are contained in the groove portion 24. Note that, in addition to the cutting chips, chips generated by the operation of the first plunger 21 may be contained in the groove portion 24.

In the present embodiment, the side surface of the first plunger is provided with the groove portion 24 for containing cutting chips and others generated when the first plunger comes into contact with the connection electrode 101, so that the interference of cutting chips having entered between the first plunger 21 and the small-diameter portion 33a with the first plunger 21 is suppressed, when the first plunger 21 moves with respect to the probe holder 3. According to the present embodiment, providing the groove portion 24 in the first plunger 21 can suppress the occurrence of the expansion and contraction operation failure of the probe 2 due to foreign materials such as cutting chips.

Figure 5:
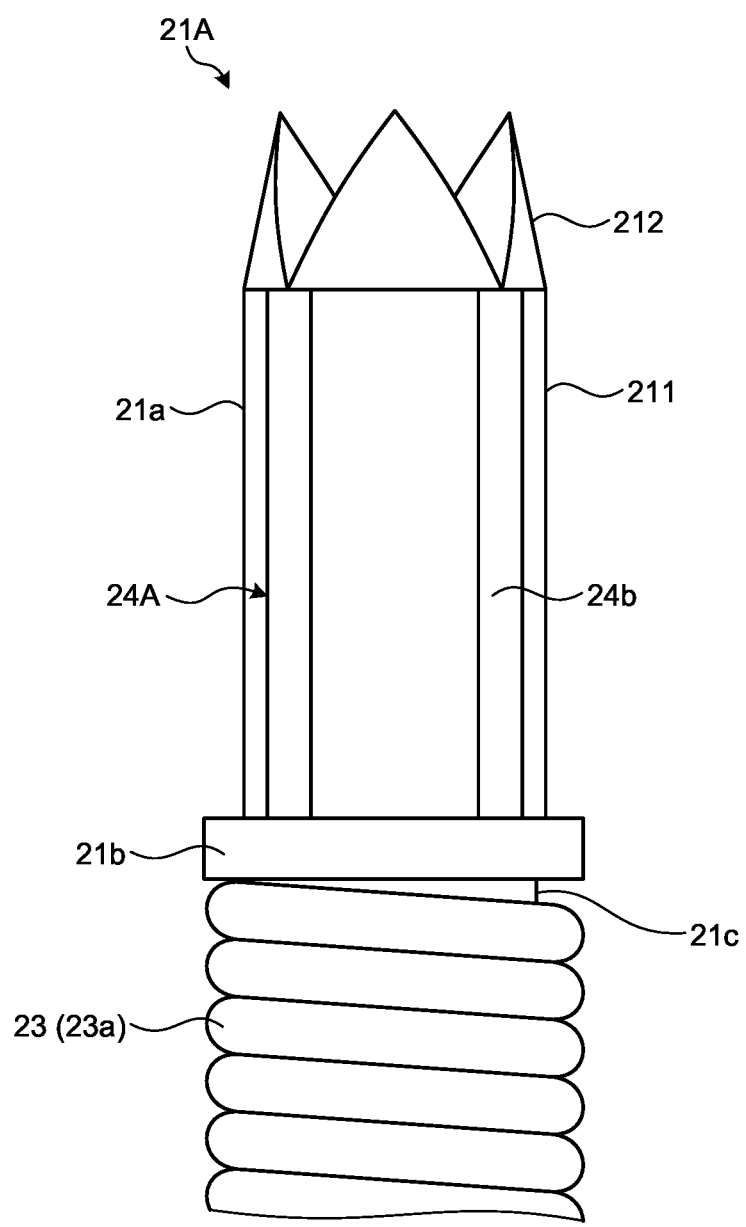
FIG. 5 is a partial cross-sectional view illustrating a configuration of a main part of a contact probe according to a first modification.

A first modification will now be described with reference to FIG. 5. FIG. 5 is a partial cross-sectional view illustrating a configuration of a main part of a contact probe according to the first modification. Note that the same components as those of the probe unit 1 according to the embodiment are denoted by the same reference numerals. The probe unit according to the first modification includes a first plunger 21A in place of the first plunger 21.

The first plunger 21A has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the first modification, a groove portion 24A is formed in a part of the side surface of the main body portion 211 of the tip portion 21a. The groove portion 24A has a plurality of bottomed recessed portions 24b extending from one end to the other end of the main body portion 211 in the longitudinal direction. The recessed portion 24b is formed at a position corresponding to between the claw portions of the contact portion 212 in the circumferential direction of the main body portion 211. Note that the longitudinal direction of the main body portion 211 is a direction extending from the contact portion 212 toward the flange portion 21b, and corresponds to the axial direction of the probe 2. The recessed portion 24b may be formed at a position corresponding to, for example, a central portion of the claw portion of the contact portion 212 in the circumferential direction of the main body portion 211.

Also in the first modification, cutting chips adhered to the contact portion 212 at the time of inspection are contained in any of the recessed portions 24b of the groove portion 24A.

In the first modification, as in the embodiment, the side surface of the first plunger 21A is provided with the groove portion 24A for containing cutting chips and others generated when the first plunger comes into contact with the connection electrode 101, so that the interference of cutting chips having entered between the first plunger 21A and the small-diameter portion 33a with the first plunger 21A is suppressed, when the first plunger 21A moves with respect to the probe holder 3. According to the first modification, providing the groove portion 24A in the first plunger 21A can suppress the occurrence of the expansion and contraction operation failure of the probe due to foreign materials such as cutting chips.

Figure 6:
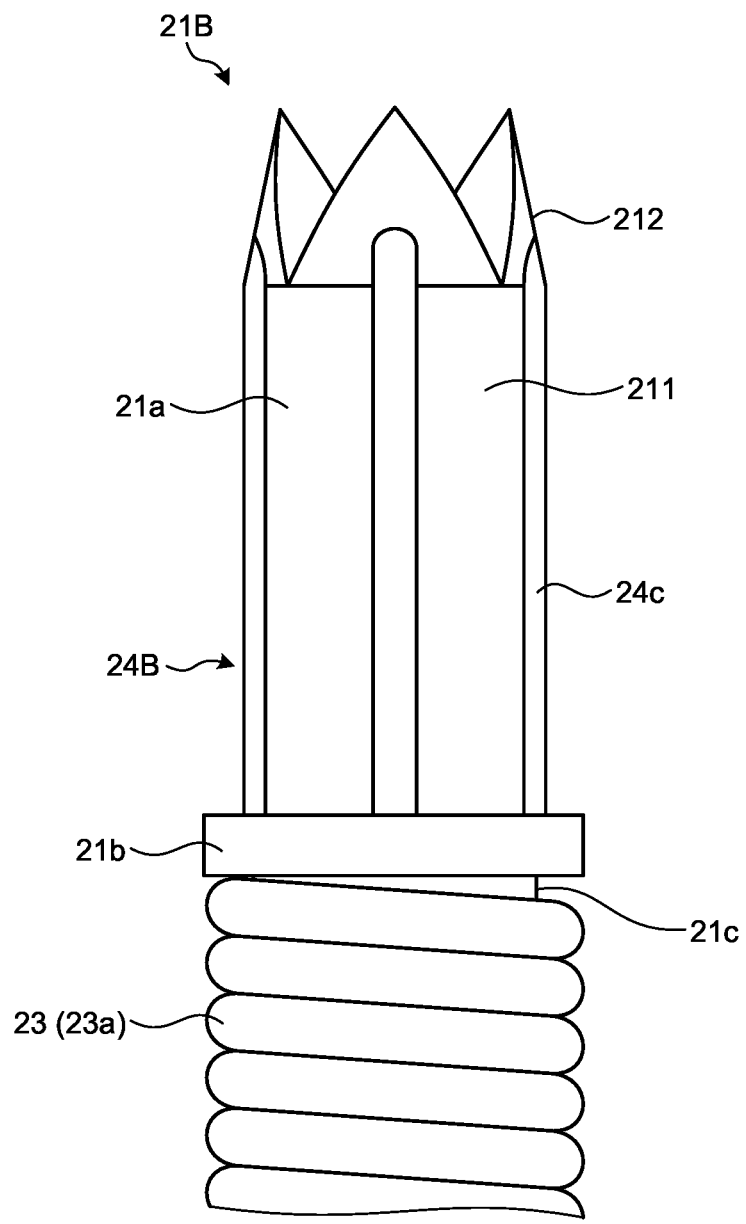
FIG. 6 is a partial cross-sectional view illustrating a configuration of a main part of a contact probe according to a second modification.

A second modification will now be described with reference to FIG. 6. FIG. 6 is a partial cross-sectional view illustrating a configuration of a main part of a contact probe according to the second modification. Note that the same components as those of the probe unit 1 according to the embodiment are denoted by the same reference numerals. The probe unit according to the second modification includes a first plunger 21B in place of the first plunger 21.

The first plunger 21B has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the second modification, a groove portion 24B is formed in a part of the side surface of the tip portion 21a. The groove portion 24B has a plurality of bottomed recessed portions 24c extending from the flange portion 21b of the main body portion 211 to a part of the contact portion 212. The recessed portion 24c extends longitudinally, in the contact portion 212, from the end portion on the main body portion 211 side to the central portion of the outer side surface of the claw portion of the contact portion 212.

Also in the second modification, cutting chips adhered to the contact portion 212 at the time of inspection are contained in any of the recessed portions 24c of the groove portion 24B.

In the second modification, as in the embodiment, the side surface of the first plunger 21B is provided with the groove portion 24B for containing cutting chips and others generated when the first plunger comes into contact with the connection electrode 101, so that the interference of cutting chips having entered between the first plunger 21B and the small-diameter portion 33a with the first plunger 21B is suppressed, when the first plunger 21B moves with respect to the probe holder 3. According to the second modification, providing the groove portion 24B in the first plunger 21B can suppress the occurrence of the expansion and contraction operation failure of the probe due to foreign materials such as cutting chips.

Figure 7:
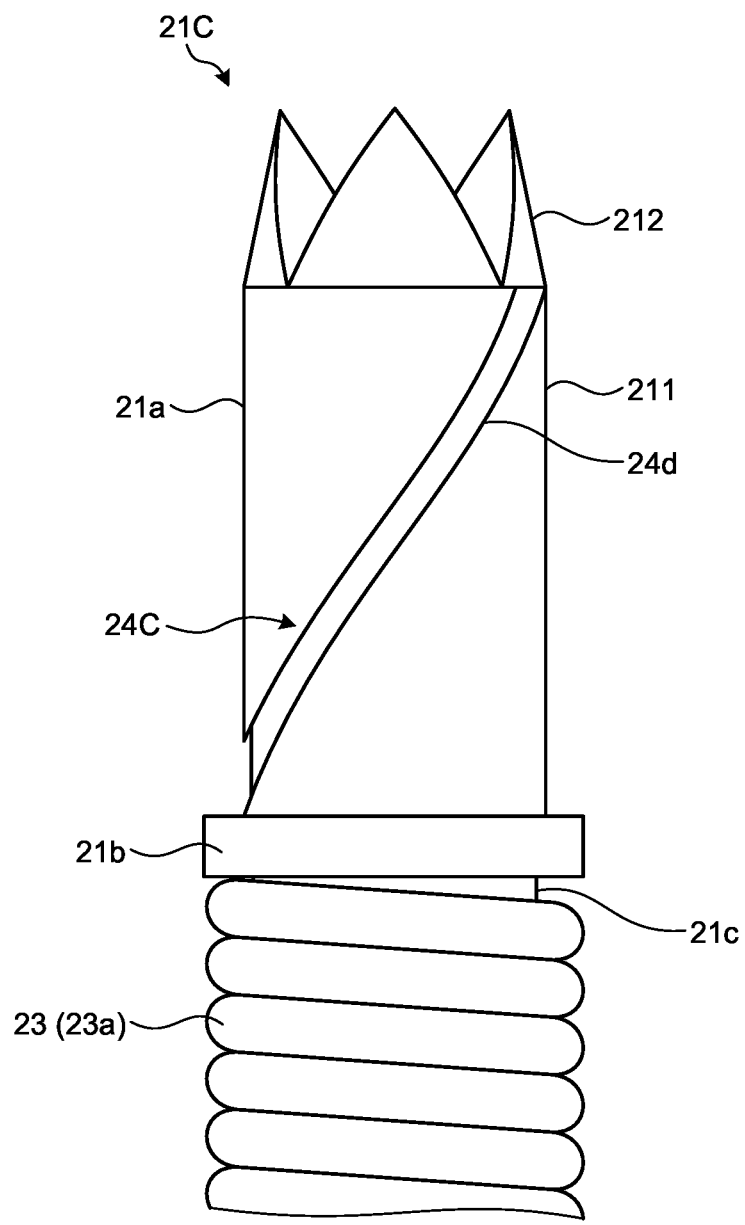
FIG. 7 is a partial cross-sectional view illustrating a configuration of a main part of a contact probe according to a third modification.

A third modification will now be described with reference to FIG. 7. FIG. 7 is a partial cross-sectional view illustrating a configuration of a main part of a contact probe according to the third modification. Note that the same components as those of the probe unit 1 according to the embodiment are denoted by the same reference numerals. The probe unit according to the third modification includes a first plunger 21C in place of the first plunger 21.

The first plunger 21C has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the third modification, a groove portion 24C is formed in a part of the side surface of the tip portion 21a. The groove portion 24C has a bottomed recessed portion 24d extending from one end to the other end of the main body portion 211 in the longitudinal direction. The recessed portion 24d extends spirally, in the main body portion 211, by rotating and translating with respect to the central axis extending in the longitudinal direction of the main body portion 211.

Also in the third modification, cutting chips adhered to the contact portion 212 at the time of inspection are contained in the recessed portion 24d of the groove portion 24C.

In the third modification, as in the embodiment, the side surface of the first plunger 21C is provided with the groove portion 24C for containing cutting chips and others generated when the first plunger comes into contact with the connection electrode 101, so that the interference of cutting chips having entered between the first plunger 21C and the small-diameter portion 33a with the first plunger 21C is suppressed, when the first plunger 21C moves with respect to the probe holder 3. According to the third modification, providing the groove portion 24C in the first plunger 21C can suppress the occurrence of the expansion and contraction operation failure of the probe due to foreign materials such as cutting chips.

According to the third modification, since the recessed portion 24d is formed in a spiral shape, when the main body portion 211 advances and retreats, the recessed portion 24d is present somewhere in the longitudinal direction, and thus it is possible to efficiently and reliably contain cutting chips in the groove portion 24C.

A groove portion may be formed by combining the spiral recessed portion according to the third modification and the linear recessed portion according to the first and second modifications.

Figure 8:
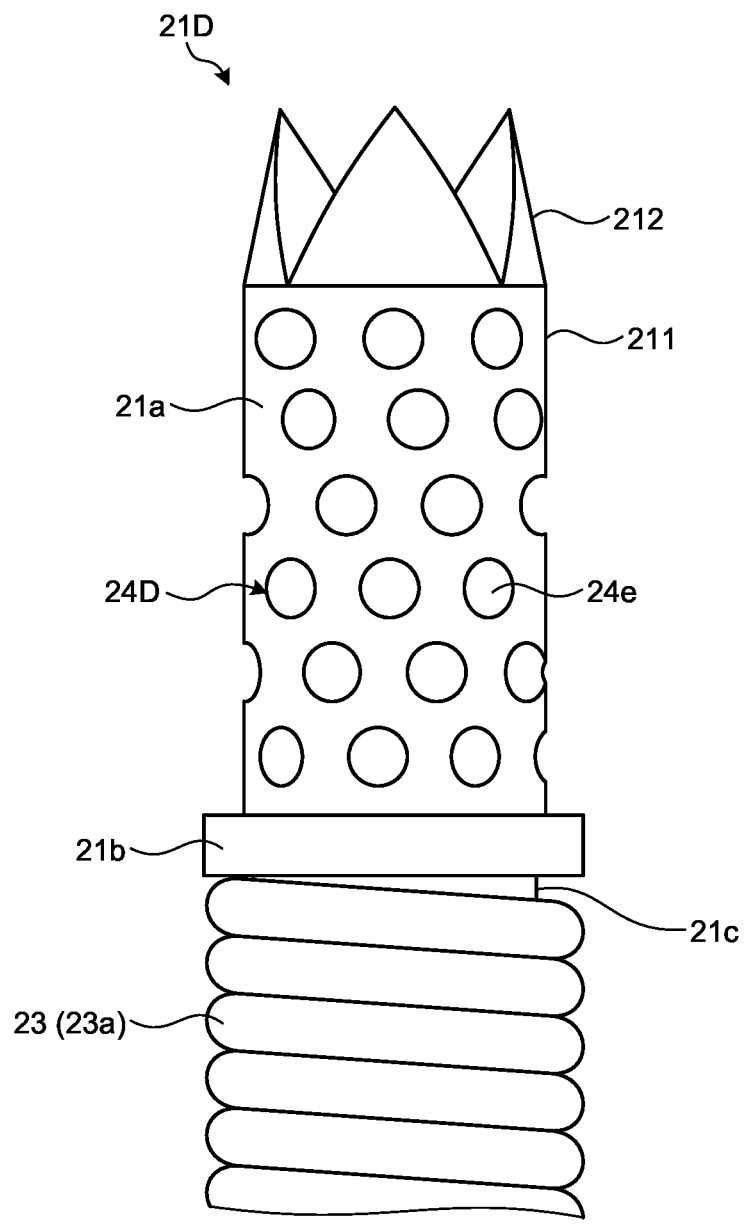
FIG. 8 is a partial cross-sectional view illustrating a configuration of a main part of a contact probe according to a fourth modification.

A fourth modification will now be described with reference to FIG. 8. FIG. 8 is a partial cross-sectional view illustrating a configuration of a main part of a contact probe according to the fourth modification. Note that the same components as those of the probe unit 1 according to the embodiment are denoted by the same reference numerals. The probe unit according to the fourth modification includes a first plunger 21D in place of the first plunger 21.

The first plunger 21D has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the fourth modification, a groove portion 24D is formed in a part of the side surface of the tip portion 21a. The groove portion 24D has a plurality of bottomed recessed portions 24e provided in the main body portion 211. The recessed portion 24d has a spherical wall surface forming a hemispherical space. The plurality of recessed portions 24e is arranged, in the main body portion 211, in a staggered grid as illustrated in FIG. 8, for example. Note that the arrangement of the recessed portions 24e is not limited to the arrangement illustrated in FIG. 8.

Also in the fourth modification, cutting chips adhered to the contact portion 212 at the time of inspection are contained in any of the recessed portions 24e of the groove portion 24D.

In the fourth modification, as in the embodiment, the side surface of the first plunger 21D is provided with the groove portion 24D for containing cutting chips and others generated when the first plunger comes into contact with the connection electrode 101, so that the interference of cutting chips having entered between the first plunger 21D and the small-diameter portion 33a with the first plunger 21D is suppressed, when the first plunger 21D moves with respect to the probe holder 3. According to the fourth modification, providing the groove portion 24D in the first plunger 21D can suppress the occurrence of the expansion and contraction operation failure of the probe due to foreign materials such as cutting chips.

Figure 9:
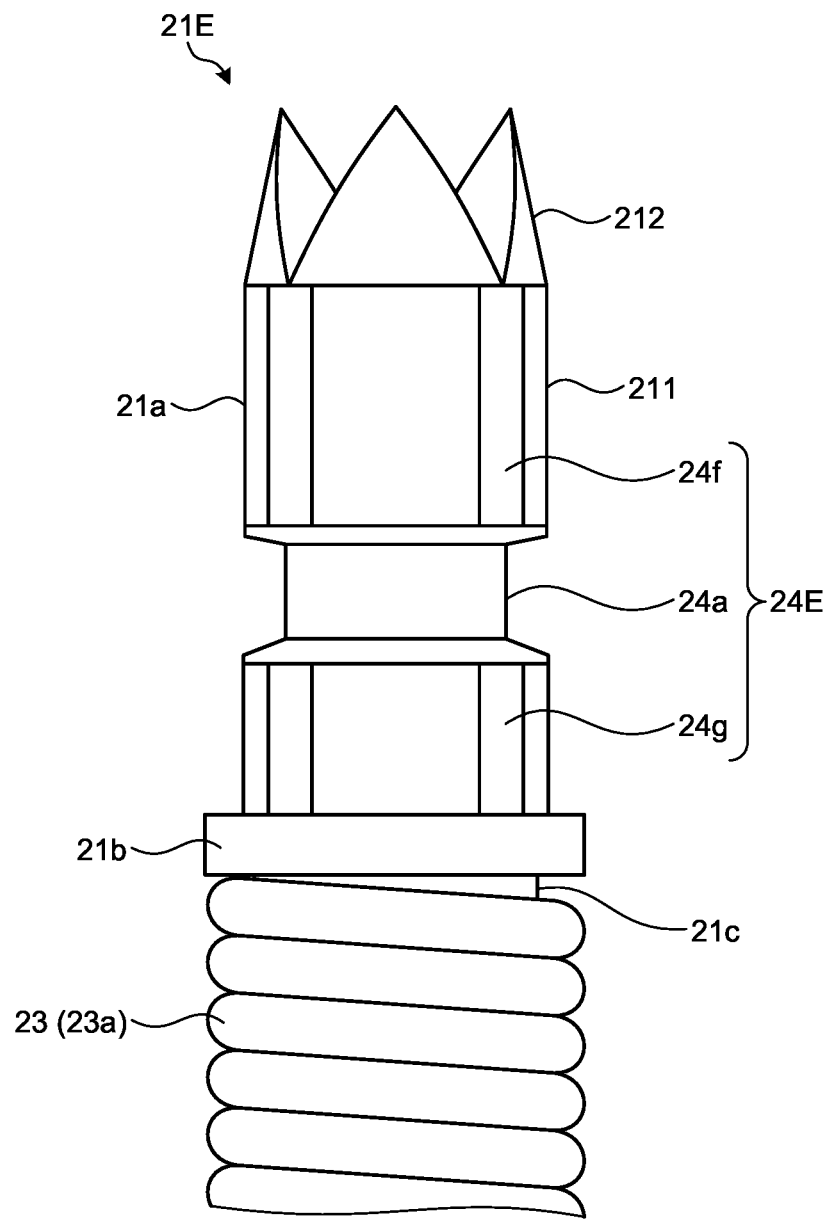
FIG. 9 is a partial cross-sectional view illustrating a configuration of a main part of a contact probe according to a fifth modification.

A fifth modification will now be described with reference to FIG. 9. FIG. 9 is a partial cross-sectional view illustrating a configuration of a main part of a contact probe according to the fifth modification. Note that the same components as those of the probe unit 1 according to the embodiment are denoted by the same reference numerals. The probe unit according to the fifth modification includes a first plunger 21E in place of the first plunger 21.

The first plunger 21E has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the fifth modification, a groove portion 24E is formed in a part of the side surface of the tip portion 21a. The groove portion 24E has a plurality of bottomed recessed portions 24a (see FIG. 3: first recessed portion), 24f (second recessed portion), and 24g (third recessed portion). The recessed portion 24f extends from an end portion of the recessed portion 24a on the contact portion 212 side to the contact portion 212 side. The recessed portion 24g extends from an end portion of the recessed portion 24a on the flange portion 21b side to the flange portion 21b side. The recessed portions 24f and 24g extend in the longitudinal direction of the main body portion 211 on the sides opposite to each other with respect to the recessed portion 24a. Note that the recessed portions 24f and 24g may be formed at positions different from each other in the circumferential direction. Although FIG. 9 illustrates an example in which the recessed portions 24f and 24g extend in the longitudinal direction of the main body portion 211, the recessed portions 24f and 24g may extend so as to be inclined with respect to the longitudinal direction.

Also in the fifth modification, cutting chips adhered to the contact portion 212 at the time of inspection are contained in any of the recessed portions 24a, 24f, and 24g of the groove portion 24E.

In the fifth modification, as in the embodiment, the side surface of the first plunger 21E is provided with the groove portion 24E for containing cutting chips and others generated when the first plunger comes into contact with the connection electrode 101, so that the interference of cutting chips having entered between the first plunger 21E and the small-diameter portion 33a with the first plunger 21E is suppressed, when the first plunger 21E moves with respect to the probe holder 3. According to the fifth modification, providing the groove portion 24E in the first plunger 21E can suppress the occurrence of the expansion and contraction operation failure of the probe due to foreign materials such as cutting chips.

Figure 10:
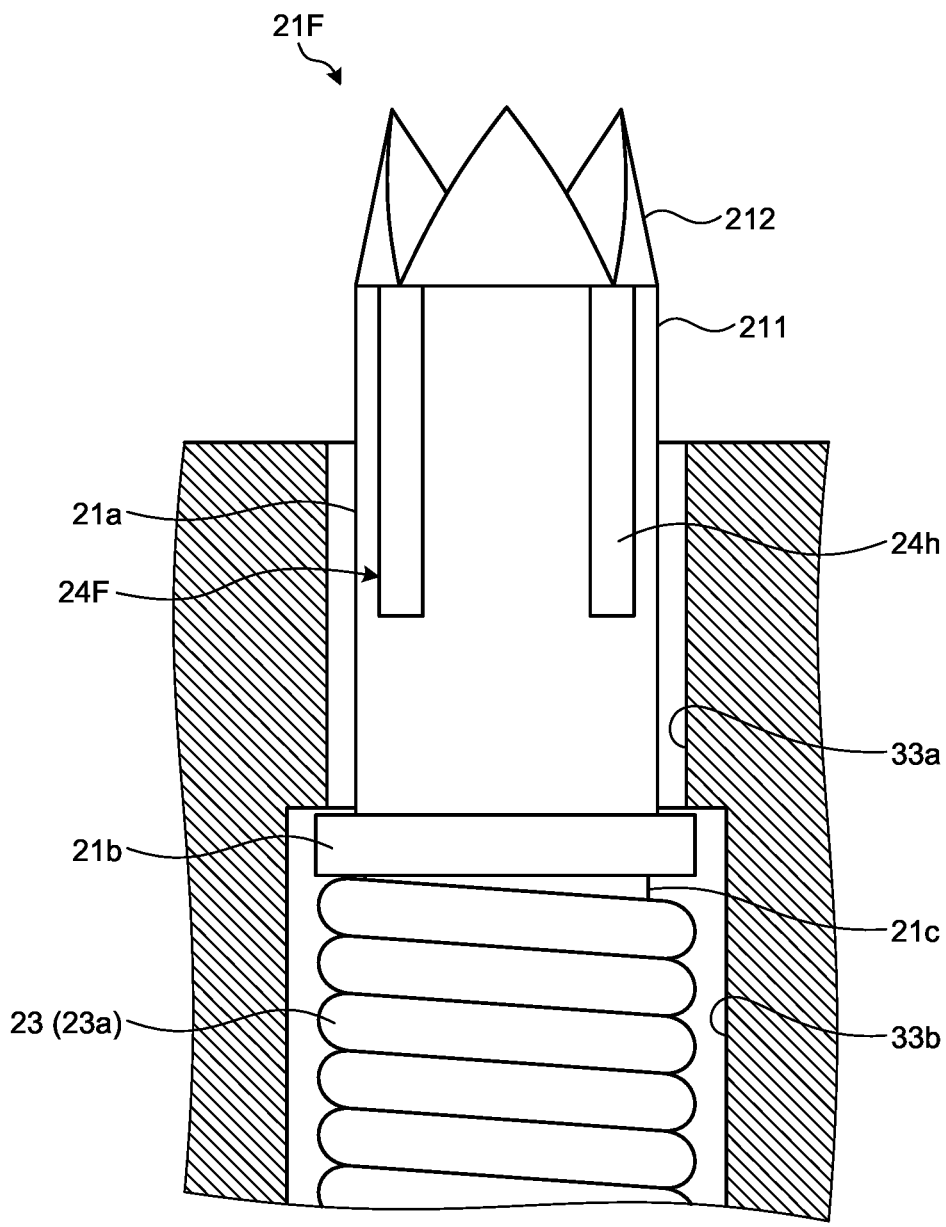
FIG. 10 is a partial cross-sectional view illustrating a configuration of a main part of a contact probe according to a sixth modification.
Figure 11:
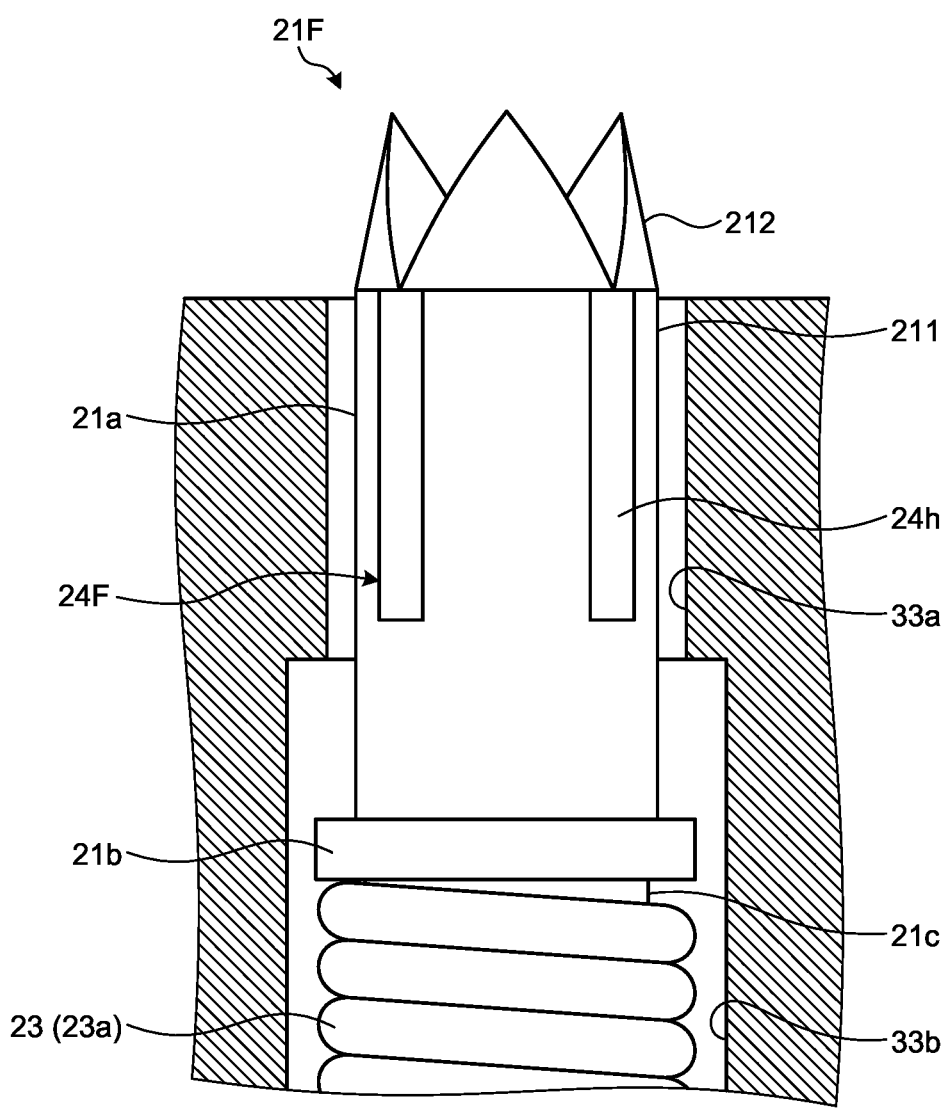
FIG. 11 is a partial cross-sectional view illustrating the configuration of the main part of the contact probe according to the sixth modification, and is a partial cross-sectional view illustrating a state when a coil spring is contracted.

A sixth modification will now be described with reference to FIGS. 10 and 11. FIGS. 10 and 11 are partial cross-sectional views illustrating a configuration of a main part of a contact probe according to the sixth modification. FIG. 10 illustrates a state in which the flange portion is in contact with the probe holder. FIG. 11 illustrates a state when the coil spring is contracted. Note that the same components as those of the probe unit 1 according to the embodiment are denoted by the same reference numerals. The probe unit according to the sixth modification includes a first plunger 21F in place of the first plunger 21.

The first plunger 21F has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the sixth modification, a groove portion 24F is formed in a part of the side surface of the tip portion 21a. The groove portion 24F has a plurality of bottomed recessed portions 24h extending from an end portion of the main body portion 211 on the contact portion 212 side to a central portion of the main body portion 211 in the longitudinal direction. The recessed portion 24h extends, in the contact portion 212, from an end portion on the main body portion 211 side to a central portion in the longitudinal direction. In a state in which the coil spring 23 is contracted and the first plunger 21F is pushed into the probe holder 3 at the time of inspection (see FIG. 11), the recessed portion 24h is set to a length that stays in the small-diameter portion 33a and does not enter the large-diameter portion 33b.

Also in the sixth modification, cutting chips adhered to the contact portion 212 at the time of inspection are contained in any of the recessed portions 24h of the groove portion 24F.

In the sixth modification, as in the embodiment, the side surface of the first plunger 21F is provided with the groove portion 24F for containing cutting chips and others generated when the first plunger comes into contact with the connection electrode 101, so that the interference of cutting chips having entered between the first plunger 21F and the small-diameter portion 33a with the first plunger 21F is suppressed, when the first plunger 21F moves with respect to the probe holder 3. According to the sixth modification, providing the groove portion 24F in the first plunger 21F can suppress the occurrence of the expansion and contraction operation failure of the probe due to foreign materials such as cutting chips.

According to the sixth modification, the groove portion 24F (recessed portion 24h) is set to a length that does not enter the large-diameter portion 33b when the coil spring 23 is contracted at the time of inspection, for example, thus suppressing cutting chips or others held by the recessed portion 24h from entering the large-diameter portions 33b, 34b, or the small-diameter portion 34a and causing operation failure of the coil spring 23 or the second plunger 22 by the cutting chips or others.

Figure 12:
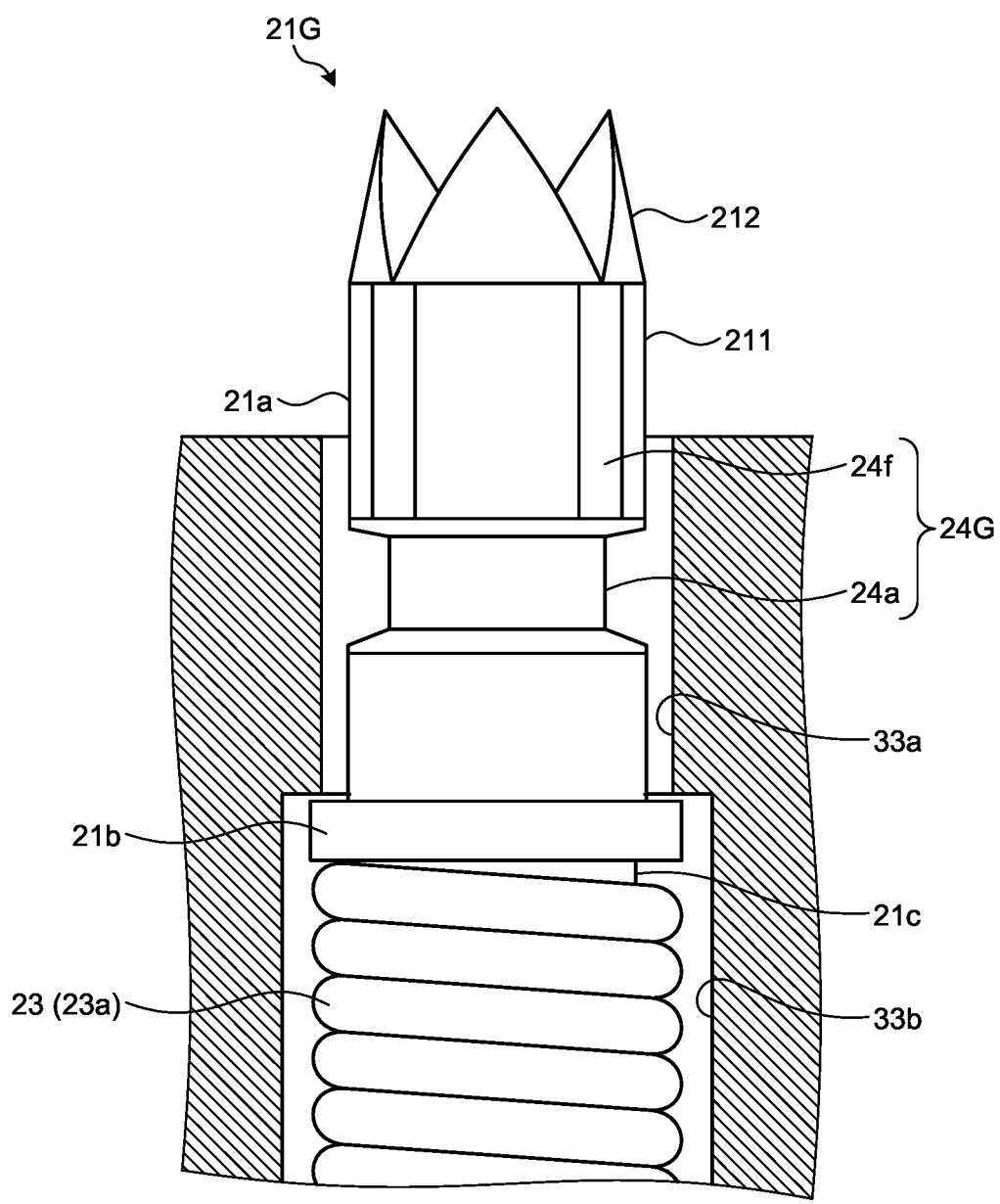
FIG. 12 is a partial cross-sectional view illustrating a configuration of a main part of a contact probe according to a seventh modification.
Figure 13:
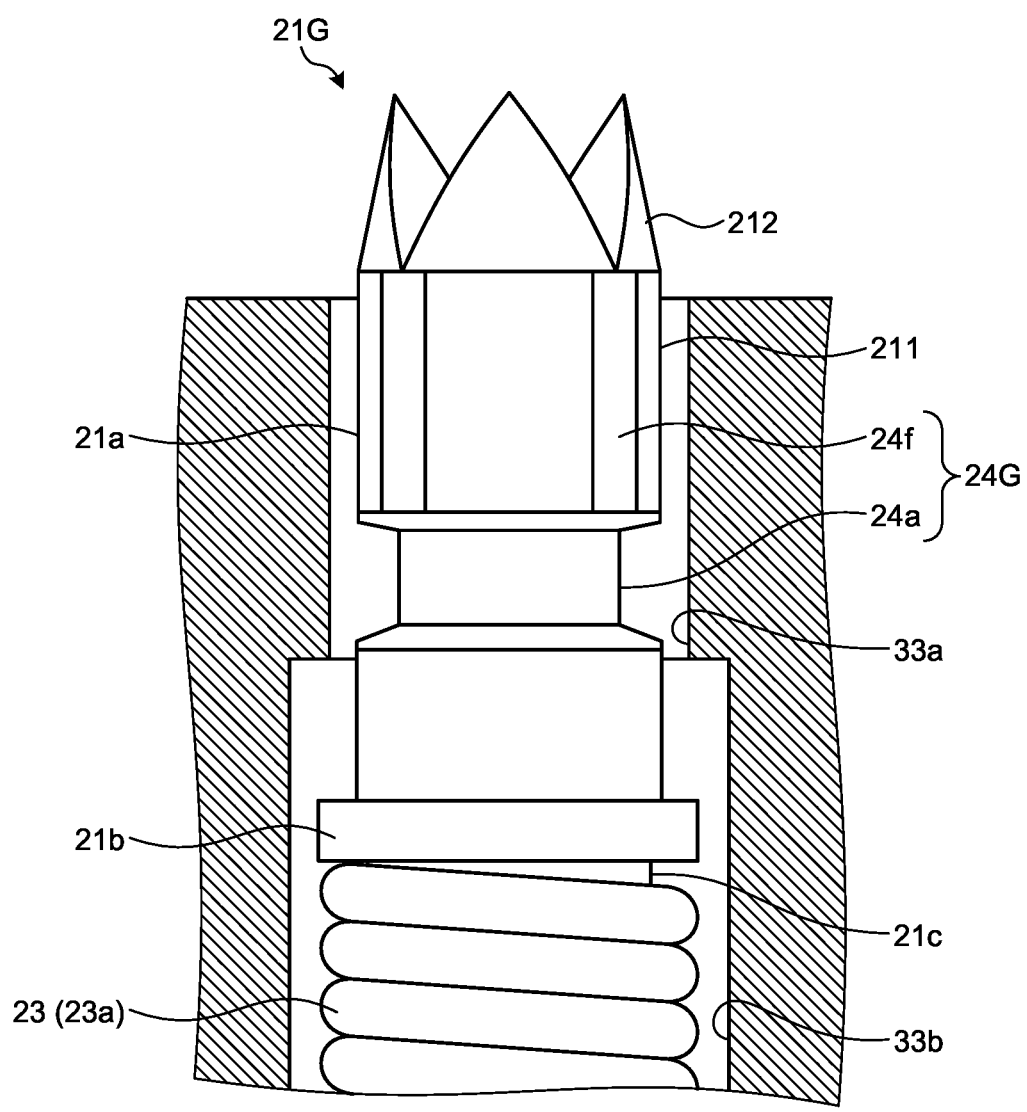
FIG. 13 is a partial cross-sectional view illustrating the configuration of the main part of the contact probe according to the seventh modification, and is a partial cross-sectional view illustrating a state when a coil spring is contracted.

A seventh modification will now be described with reference to FIGS. 12 and 13. FIGS. 12 and 13 are partial cross-sectional views illustrating a configuration of a main part of a contact probe according to the seventh modification. FIG. 12 illustrates a state in which the flange portion is in contact with the probe holder. FIG. 13 illustrates a state when the coil spring is contracted. Note that the same components as those of the probe unit 1 according to the embodiment are denoted by the same reference numerals. The probe unit according to the seventh modification includes a first plunger 21G in place of the first plunger 21.

The first plunger 21G has a tip portion 21a which has a tapered tip shape and comes into contact with the electrode of the semiconductor integrated circuit 100, a flange portion 21b having a diameter larger than that of the tip portion 21a, and a base end portion 21c which extends to the side opposite to the tip portion 21a via the flange portion 21b, has a diameter smaller than that of the flange portion 21b, and into which one end portion of the coil spring 23 is press-fitted.

In the seventh modification, a groove portion 24G is formed in a part of the side surface of the tip portion 21a. The groove portion 24G has a plurality of bottomed recessed portions 24a (see FIG. 3) and 24f (see FIG. 9). In a state in which the coil spring 23 is contracted and the first plunger 21G is pushed into the probe holder 3 at the time of inspection (see FIG. 13), the recessed portion 24a is formed at a position where the recessed portion stays in the small-diameter portion 33a and does not enter the large-diameter portion 33b.

Also in the seventh modification, cutting chips adhered to the contact portion 212 at the time of inspection are contained in any of the recessed portions 24a and 24f of the groove portion 24G.

In the seventh modification, as in the embodiment, the side surface of the first plunger 21G is provided with the groove portion 24G for containing cutting chips and others generated when the first plunger comes into contact with the connection electrode 101, so that the interference of cutting chips having entered between the first plunger 21G and the small-diameter portion 33a with the first plunger 21G is suppressed, when the first plunger 21G moves with respect to the probe holder 3. According to the seventh modification, providing the groove portion 24G in the first plunger 21G can suppress the occurrence of the expansion and contraction operation failure of the probe due to foreign materials such as cutting chips.

According to the seventh modification, the groove portion 24G (recessed portion 24a) is set to a length that does not enter the large-diameter portion 33b when the coil spring 23 is contracted at the time of inspection, for example, thus suppressing cutting chips or others held by the recessed portion 24a from entering the large-diameter portions 33b, 34b, or the small-diameter portion 34a and causing operation failure of the coil spring 23 or the second plunger 22 by the cutting chips or others.

Note that, in the sixth and seventh modifications, it has been described that the groove portion is formed at a position where the groove portion does not enter the large-diameter portion 33b, but the groove portion may be formed at a position where the groove portion enters the large-diameter portion 33b when the coil spring 23 is contracted. As described above, it is also possible to adopt a configuration in which the cutting chips that have come into contact with the first plunger are actively dropped onto the large-diameter portion 33b.

Figure 14:
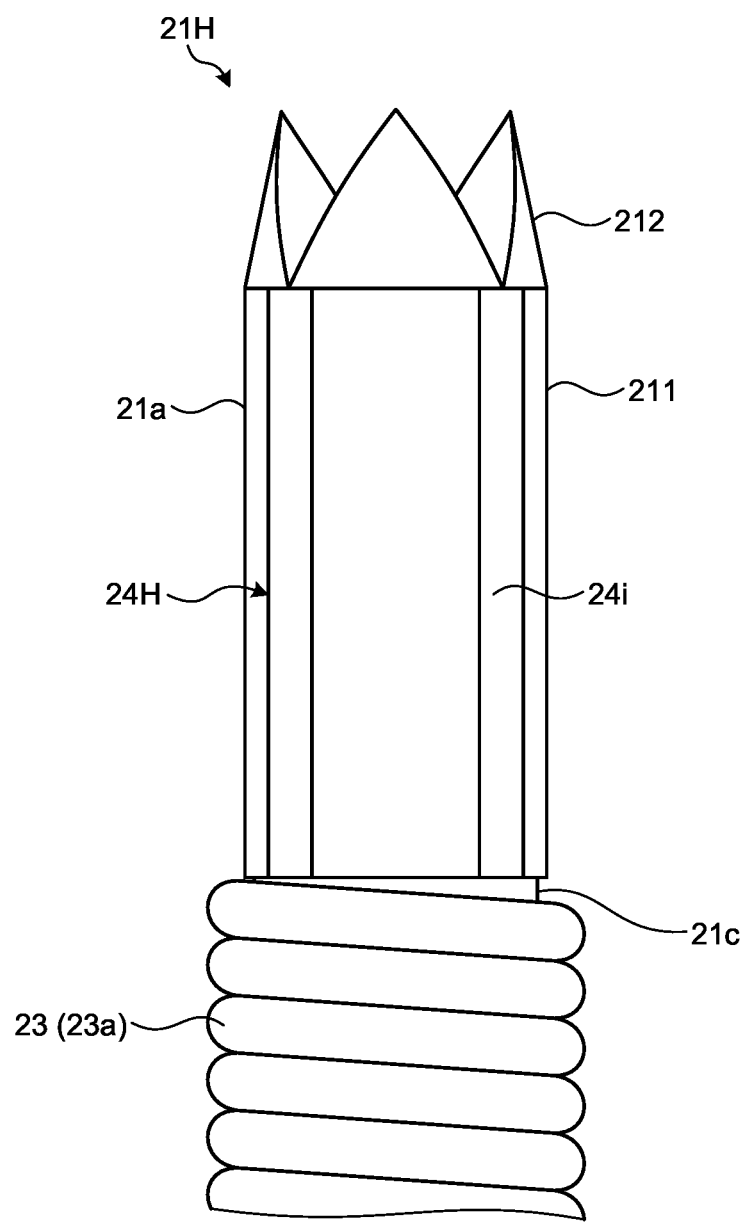
FIG. 14 is a partial cross-sectional view illustrating a configuration of a main part of a contact probe according to an eighth modification.

An eighth modification will now be described with reference to FIG. 14. FIG. 14 is a partial cross-sectional view illustrating a configuration of a main part of a contact probe according to the eighth modification. Note that the same components as those of the probe unit 1 according to the embodiment are denoted by the same reference numerals. The probe unit according to the eighth modification includes a first plunger 21H in place of the first plunger 21.

The first plunger 21H has a tip portion 21a which has a tapered tip shape and comes into contact with the electrode of the semiconductor integrated circuit 100, and a base end portion 21c which is continuous with the base end side of the tip portion 21a and into which one end portion of the coil spring 23 is press-fitted. The first plunger 21H has a configuration that does not have a flange portion 21b with respect to the first plunger 21.

In the eighth modification, a groove portion 24H is formed in a part of the side surface of the main body portion 211 of the tip portion 21a. The groove portion 24H has a plurality of bottomed recessed portions 24i extending from one end to the other end of the main body portion 211 in the longitudinal direction. The recessed portion 24i is formed at a position corresponding to between the claw portions of the contact portion 212 in the circumferential direction of the main body portion 211. Note that the recessed portion 24i may be formed at a position corresponding to, for example, a central portion of the claw portion of the contact portion 212 in the circumferential direction of the main body portion 211.

Also in the eighth modification, cutting chips adhered to the contact portion 212 at the time of inspection are contained in any of the recessed portions 24i of the groove portion 24H.

In the eighth modification, as in the embodiment, the side surface of the first plunger 21H is provided with the groove portion 24H for containing cutting chips and others generated when the first plunger comes into contact with the connection electrode 101, so that the interference of cutting chips having entered between the first plunger 21H and the small-diameter portion 33a with the first plunger 21H is suppressed, when the first plunger 21H moves with respect to the probe holder 3. According to the eighth modification, providing the groove portion 24i in the first plunger 21H can suppress the occurrence of the expansion and contraction operation failure of the probe due to foreign materials such as cutting chips.

Figure 15:
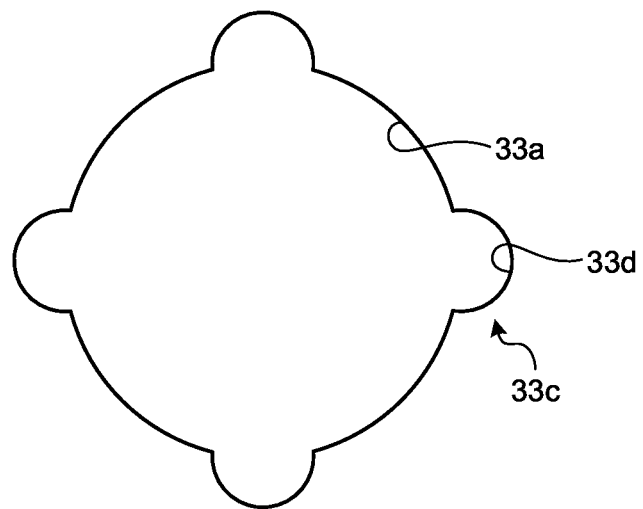
FIG. 15 is a diagram illustrating a shape of an opening of a small-diameter portion of a probe holder according to a ninth modification.

A ninth modification will now be described with reference to FIG. 15. FIG. 15 is a diagram illustrating a shape of an opening of a small-diameter portion of a probe holder according to the ninth modification. Note that the same components as those of the probe unit 1 according to the embodiment are denoted by the same reference numerals. In the probe unit according to the ninth modification, a groove portion 33c is formed in the small-diameter portion 33a of the probe holder 3.

In the ninth modification, the small-diameter portion 33a is formed with the groove portion 33c that forms an internal space protruding with respect to the outer edge of the small-diameter portion 33a. The groove portion 33c has a plurality of (four in the ninth modification) recessed portions 33d whose arcuate wall surfaces have a radius of curvature smaller than that of the small-diameter portion 33a and which extend in the longitudinal direction of the small-diameter portion 33a. The longitudinal direction of the small-diameter portion 33a is a direction parallel to the axial direction of the holder hole 33. Note that the groove portion may have a bottom portion on the large-diameter portion side, or may also be formed in the large-diameter portion.

Also in the ninth modification, cutting chips adhered to the contact portion 212 at the time of inspection are contained in any of the recessed portions 33d of the groove portion 33c.

In the ninth modification, the small-diameter portion 33a of the probe holder 3 is provided with the groove portion 33c for containing the cutting chips and others generated when the probe holder comes into contact with the connection electrode 101, so that the interference of cutting chips having entered between the first plunger 21 and the small-diameter portion 33a with the first plunger 21 is suppressed, when the first plunger 21 moves with respect to the probe holder 3. According to the ninth modification, providing the groove portion 33c in probe holder 3 can suppress the occurrence of the expansion and contraction operation failure of the probe due to foreign materials such as cutting chips.

Figure 16:
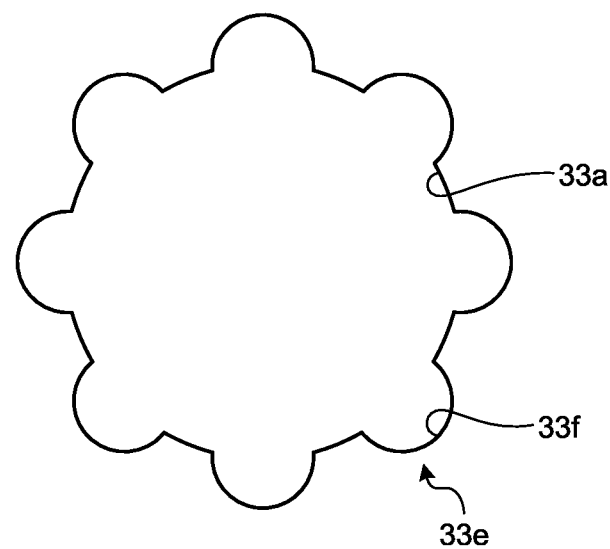
FIG. 16 is a diagram illustrating a shape of an opening of a small-diameter portion of a probe holder according to a tenth modification.

A tenth modification will now be described with reference to FIG. 16. FIG. 16 is a diagram illustrating a shape of an opening of a small-diameter portion of a probe holder according to the tenth modification. Note that the same components as those of the probe unit 1 according to the embodiment are denoted by the same reference numerals. In the probe unit according to the tenth modification, a groove portion 33e is formed in the small-diameter portion 33a of the probe holder 3.

In the tenth modification, the small-diameter portion 33a is formed with the groove portion 33e that forms an internal space protruding with respect to the outer edge of the small-diameter portion 33a. The groove portion 33e has a plurality of (eight in the tenth modification) recessed portions 33f whose arcuate wall surfaces have a radius of curvature smaller than that of the small-diameter portion 33a and which extend in the longitudinal direction of the small-diameter portion 33a.

Also in the tenth modification, cutting chips adhered to the contact portion 212 at the time of inspection are contained in any of the recessed portions 33f of the groove portion 33e.

In the tenth modification, the small-diameter portion 33a of the probe holder 3 is provided with the groove portion 33e for containing the cutting chips and others generated when the probe holder comes into contact with the connection electrode 101, so that the interference of cutting chips having entered between the first plunger 21 and the small-diameter portion 33*a* with the first plunger 21 is suppressed, when the first plunger 21 moves with respect to the probe holder 3. According to the tenth modification, providing the groove portion 33*e* in probe holder 3 can suppress the occurrence of the expansion and contraction operation failure of the probe due to foreign materials such as cutting chips.

Note that the shape and the number of the groove portions (recessed portions) formed in the small-diameter portion 33*a* are not limited to those in the ninth and tenth modifications.

Although the embodiments for carrying out the present disclosure have been described above, the present disclosure should not be limited only to the above-described embodiments. For example, the shape of the first plunger may be different depending on the attachment position or the shape or arrangement of the connection electrode. The groove portion formed in the first plunger may be combined with the groove portion formed in the probe holder. Further, the present disclosure may also be applied to a so-called barrel probe in which the flange portions and the base end portions of the first and second plungers and the coil spring are covered with a cylindrical member.

As described above, the present disclosure may include various embodiments and others which are not described herein, and various design changes and others may be made without departing from the technical idea specified by the claims.

As explained above, the contact probe, the probe holder, and the probe unit according to the present disclosure are suitable for suppressing the occurrence of an expansion and contraction operation failure due to foreign materials.

The present disclosure has the effect of capable of suppressing the occurrence of an expansion and contraction operation failure due to foreign materials.

All examples and conditional language recited herein are intended for pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although the embodiment has been described in detail, it should be understood that the various changes, substitutions, and alterations could be made hereto without departing from the spirit and scope of the disclosure.

What is claimed is:

1. A contact probe comprising:
   a first plunger;
   a second plunger; and
   a coil spring provided between the first and second plungers and configured to connect the first and second plungers to each other so as to freely advance and retreat,
   wherein the first plunger is provided with a groove portion formed on a side surface of the first plunger,
   the first plunger includes:
     a tip portion including
       a main body portion having a columnar shape, and
       a contact portion provided at one end of the main body portion and configured to contact a contact target; and
     a base end portion provided on a side opposite to the contact portion side of the main body portion and to which a coil spring is connected, and
   the groove portion includes a recessed portion extending from one end to the other end of the main body portion in a longitudinal direction,
   the contact portion includes a plurality of claw portions arranged in a circumferential direction, and
   the groove portion is formed by being provided with the recessed portion at a position corresponding to between the claw portions in a circumferential direction.

2. A probe unit comprising:
   the contact probe according to claim 1; and
   a probe holder including a holder hole configured to hold the contact probe.

3. The probe unit according to claim 1 wherein the holder hole includes:
   a small-diameter portion through which a tip portion of the first plunger is inserted; and
   a large-diameter portion configured to house the base end portion, and
   the groove portion is provided in the tip portion, and in a state in which the coil spring is contracted and the first plunger is pushed into a probe holder, an end portion of the groove portion on the base end portion side is positioned in the small-diameter portion.

4. A contact probe comprising:
   a first plunger;
   a second plunger; and
   a coil spring provided between the first and second plungers and configured to connect the first and second plungers to each other so as to freely advance and retreat,
   wherein the first plunger is provided with a groove portion formed on a side surface of the first plunger,
   the first plunger includes:
     a tip portion including
       a main body portion having a columnar shape, and
       a contact portion provided at one end of the main body portion and configured to contact a contact target; and
     a base end portion provided on a side opposite to the contact portion side of the main body portion and to which a coil spring is connected, and
   the groove portion is formed, in the main body portion, by being provided with, in a staggered grid, a plurality of recessed portions formed by recessing a part of the main body portion.

5. A probe unit comprising:
   the contact probe according to claim 4; and
   a probe holder including a holder hole configured to hold the contact probe.

6. The probe unit according to claim 5, wherein the holder hole includes:
   a small-diameter portion through which a tip portion of the first plunger is inserted; and
   a large-diameter portion configured to house the base end portion, and
   the groove portion is provided in the tip portion, and in a state in which the coil spring is contracted and the first plunger is pushed into a probe holder, an end portion of the groove portion on the base end portion side is positioned in the small-diameter portion.

7. A contact probe comprising:
   a first plunger;
   a second plunger; and a coil spring provided between the first and second plungers and configured to connect the first and second plungers to each other so as to freely advance and retreat, wherein the first plunger is provided with a groove portion formed on a side surface of the first plunger, the first plunger includes:
- a tip portion including
  - a main body portion having a columnar shape, and
  - a contact portion provided at one end of the main body portion and configured to contact a contact target; and
- a base end portion provided on a side opposite to the contact portion side of the main body portion and to which a coil spring is connected, and the groove portion includes:
- a first recessed portion formed by recessing a part of the main body portion and extending along a circumferential direction; and
- a second recessed portion extending from the first recessed portion to the base end portion side.

8. The contact probe according to claim 7, wherein the groove portion further includes a third recessed portion extending from the first recessed portion to the contact portion side.

9. A probe unit comprising:
- the contact probe according to claim 7; and
- a probe holder including a holder hole configured to hold the contact probe.

10. The probe unit according to claim 9, wherein the holder hole includes:
- a small-diameter portion through which a tip portion of the first plunger is inserted; and
- a large-diameter portion configured to house the base end portion, and
- the groove portion is provided in the tip portion, and in a state in which the coil spring is contracted and the first plunger is pushed into a probe holder, an end portion of the groove portion on the base end portion side is positioned in the small-diameter portion.

* * * * *